(12) United States Patent
Sudo

(10) Patent No.: US 8,860,104 B2
(45) Date of Patent: Oct. 14, 2014

(54) SEMICONDUCTOR DEVICE AND METHOD FOR MANUFACTURING SAME

(75) Inventor: Gaku Sudo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 13/409,319

(22) Filed: Mar. 1, 2012

(65) Prior Publication Data

US 2013/0056810 A1    Mar. 7, 2013

(30) Foreign Application Priority Data

Sep. 6, 2011    (JP) .................................. 2011-194161

(51) Int. Cl.
*H01L 29/82* (2006.01)
*H01L 21/8234* (2006.01)
*G11C 11/16* (2006.01)
*H01L 27/088* (2006.01)

(52) U.S. Cl.
CPC .... *H01L 21/823431* (2013.01); *G11C 11/1659* (2013.01); *H01L 27/0886* (2013.01)
USPC ................... 257/295; 257/330; 257/E29.272; 257/E21.665; 257/E29.255

(58) Field of Classification Search
CPC .. H01L 27/226; H01L 27/228; H01L 27/7827
USPC .................. 257/295, 330, E29.255, E21.665
See application file for complete search history.

(56) References Cited

U.S. PATENT DOCUMENTS

| | | | |
|---|---|---|---|
| 2004/0150071 A1 | 8/2004 | Kondo et al. | |
| 2004/0259295 A1 | 12/2004 | Tomiye et al. | |
| 2007/0235785 A1 | 10/2007 | Kahng et al. | |
| 2008/0023757 A1 | 1/2008 | Kujirai | |
| 2008/0081405 A1 | 4/2008 | Jang et al. | |
| 2009/0294874 A1* | 12/2009 | Lee ............................... | 257/401 |
| 2010/0163976 A1 | 7/2010 | Lee et al. | |
| 2010/0261328 A1 | 10/2010 | Kujirai | |
| 2011/0069534 A1 | 3/2011 | Inaba | |
| 2012/0008367 A1* | 1/2012 | Kajiyama ..................... | 365/148 |

OTHER PUBLICATIONS

Notification of Comments issued by the Korean Patent Office on Apr. 25, 2013, for Korean Patent Application No. 10-2012-22025, and English-language translation thereof.
Yang, F. L. et al., "35nm CMOS FinFETs," 2002 Symposium on VLSI Technology Digest of Technical Papers, 2 sheets (2002).
Notification of Reason(s) for Refusal issued by the Japanese Patent Office on Jan. 7, 2014, for Japanese Patent Application No. 2011-194161, and English-language translation thereof.
Sudo, U.S. Appl. No. 13/421,729, filed Mar. 15, 2012.
Sudo, U.S. Appl. No. 13/417,524, filed Mar. 12, 2012.
Notification of Reason(s) for Refusal issued by the Japanese Patent Office on Mar. 18, 2014, for Japanese Patent Application No. 2011-194161, and English-language translation thereof.
Office Action issued by the Taiwanese Intellectual Property Office on Dec. 18, 2013, for Taiwanese Patent Application No. 101105148, and English-language translation thereof.

* cited by examiner

*Primary Examiner* — Minchul Yang
(74) *Attorney, Agent, or Firm* — Finnegan, Henderson, Farabow, Garrett & Dunner, L.L.P.

(57) ABSTRACT

According to one embodiment, a semiconductor device includes, a semiconductor substrate including a plurality of fins formed in an upper surface of the semiconductor substrate in a first region to extend in a first direction, a first gate electrode extending in a second direction intersecting the first direction to straddle the fins, a first gate insulating film provided between the first gate electrode and the fins, a second gate electrode provided on the semiconductor substrate in the second region; and a second gate insulating film provided between the semiconductor substrate and the second gate electrode. A layer structure of the first gate electrode is different from a layer structure of the second gate electrode.

4 Claims, 17 Drawing Sheets

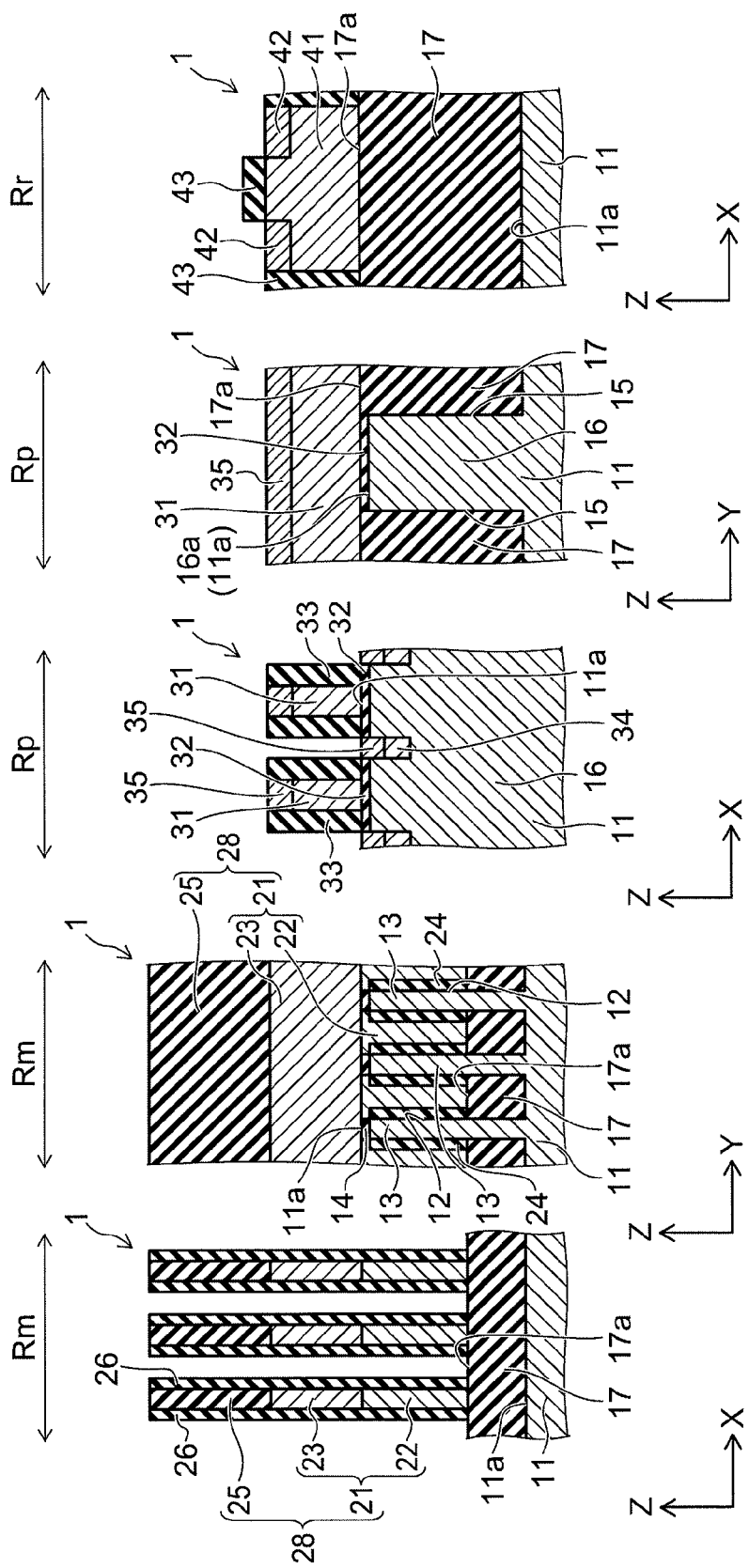

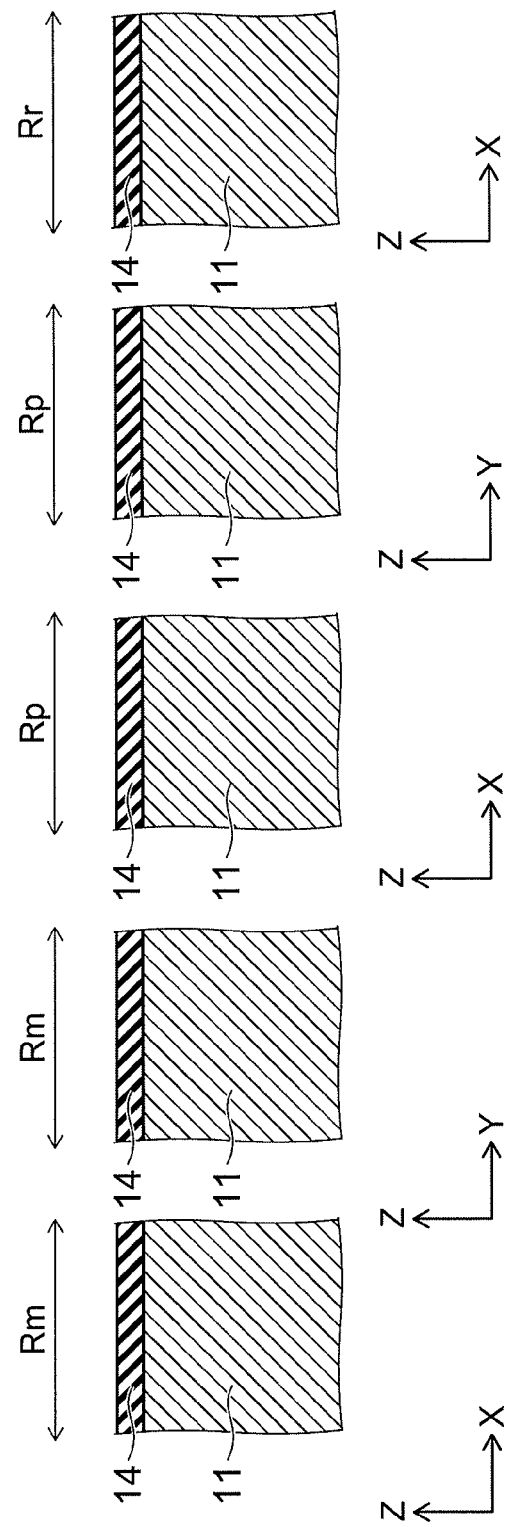

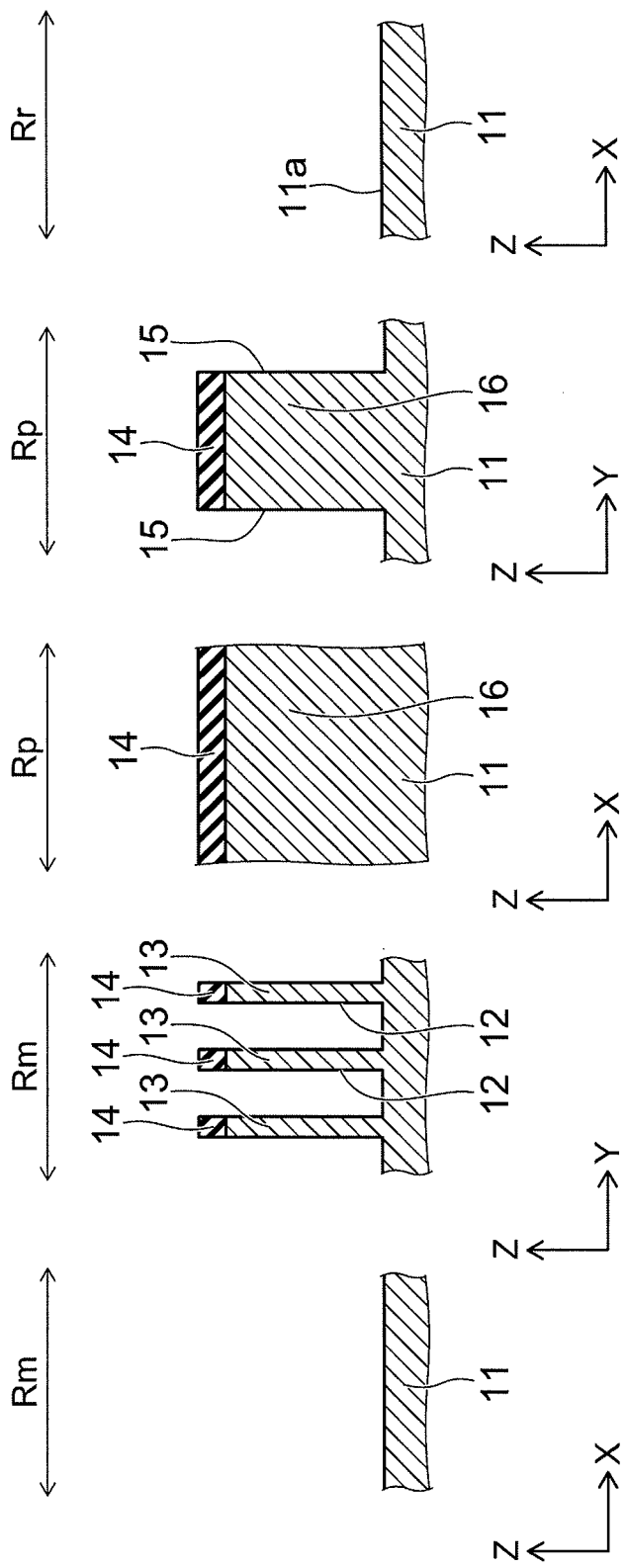

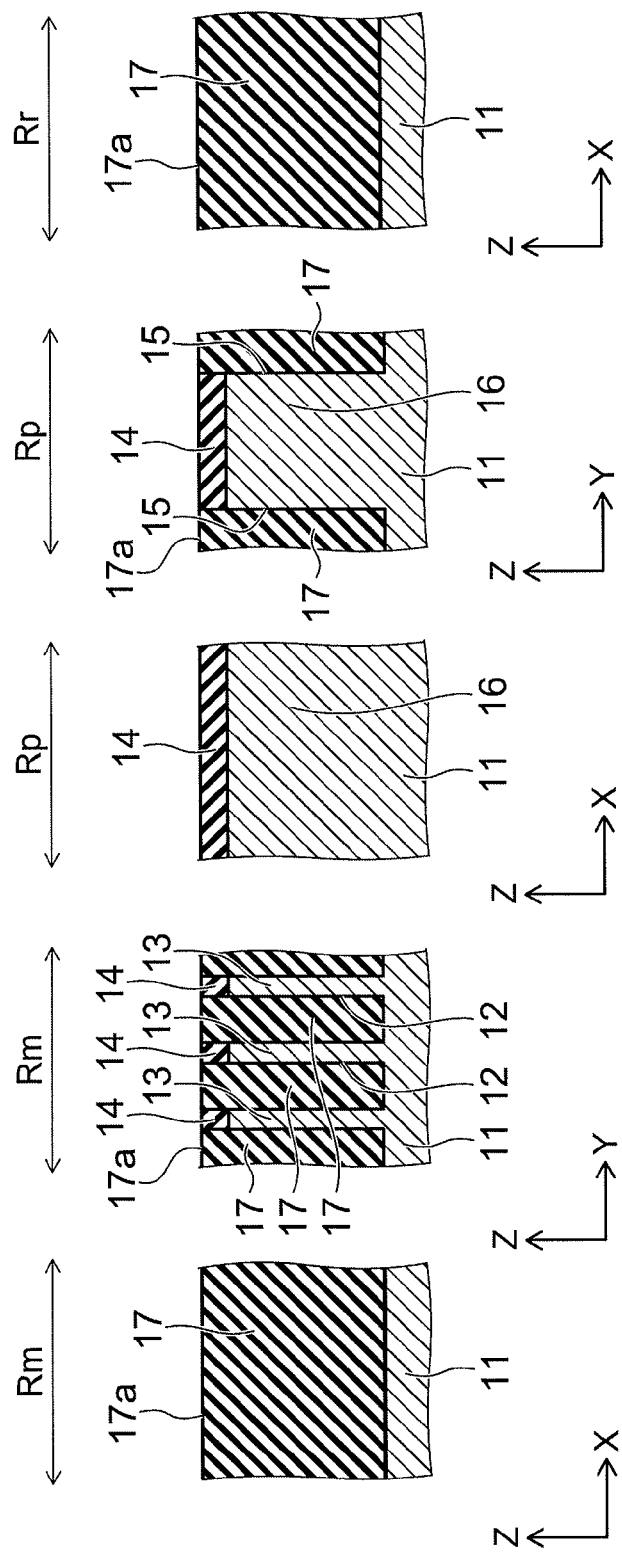

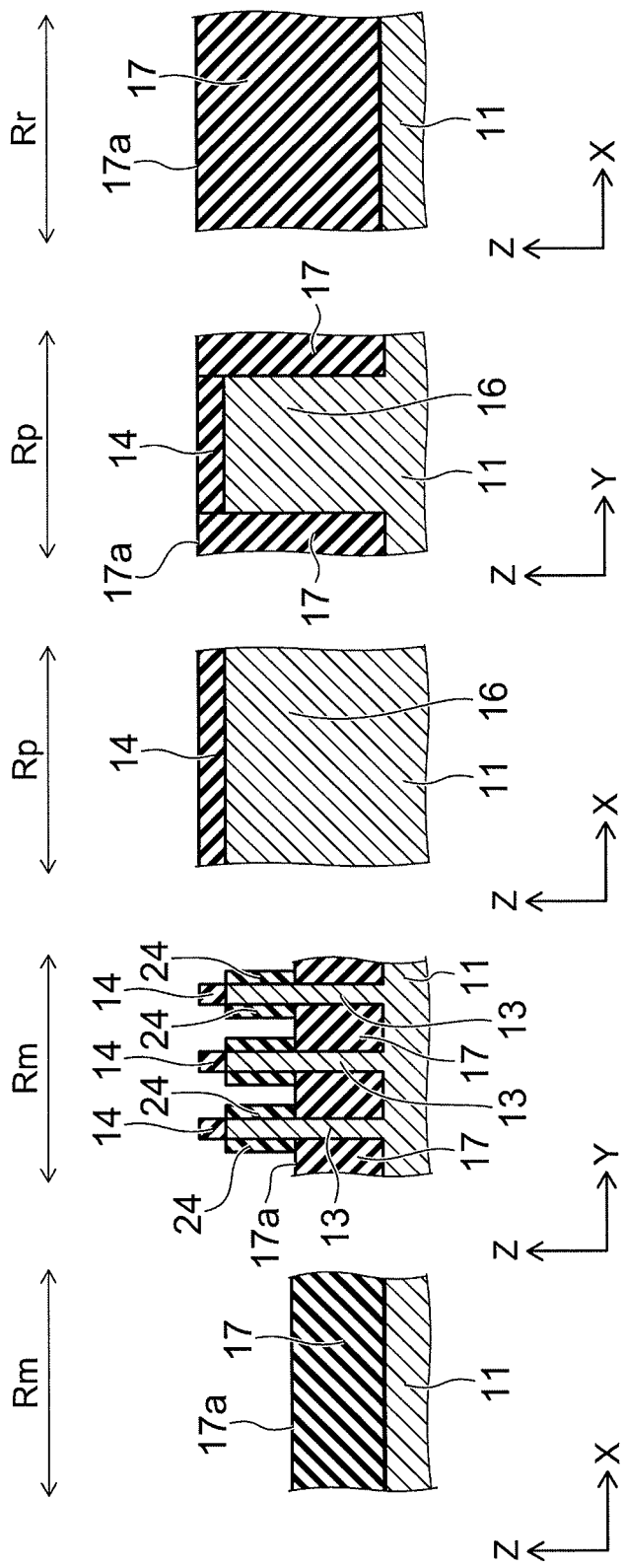

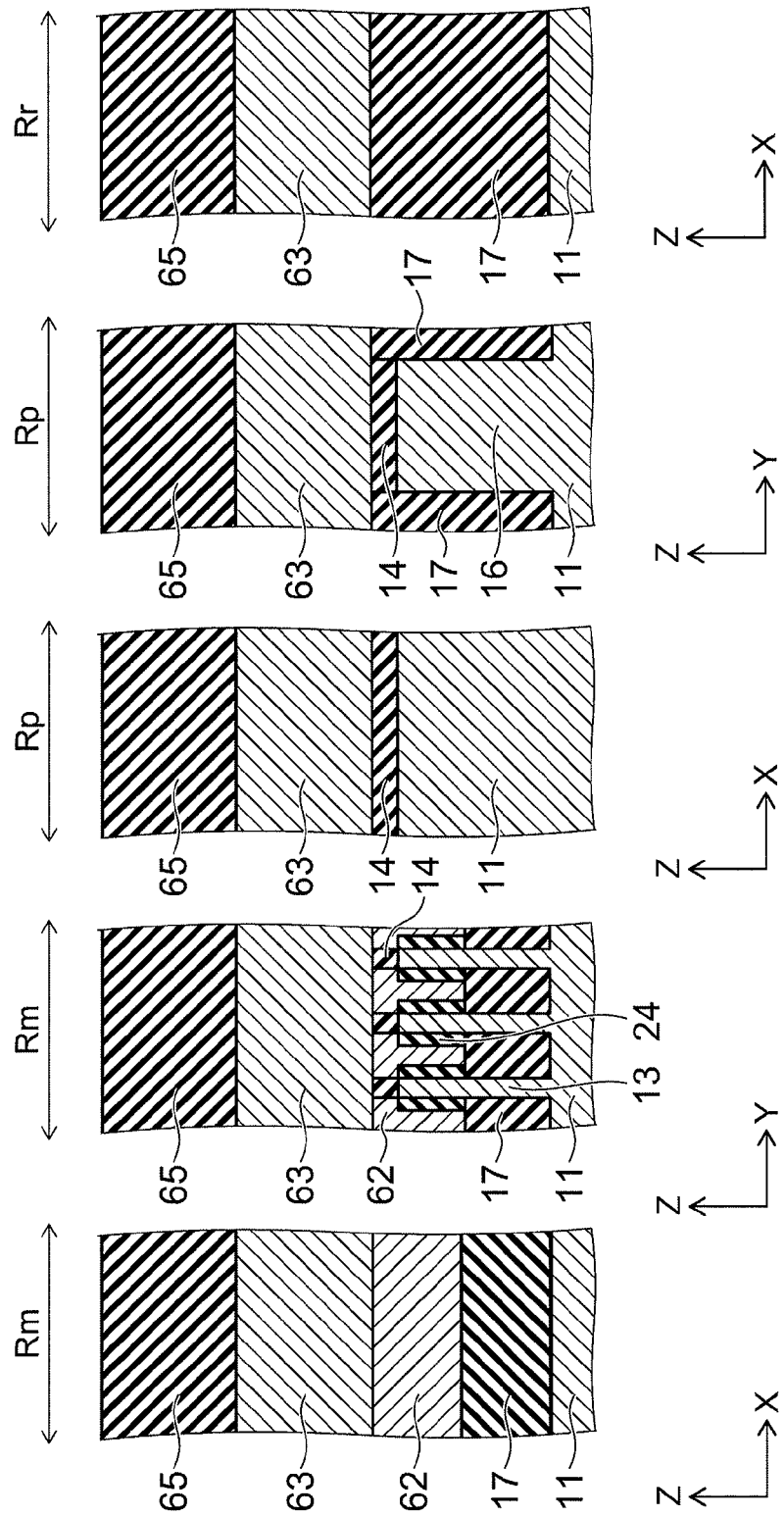

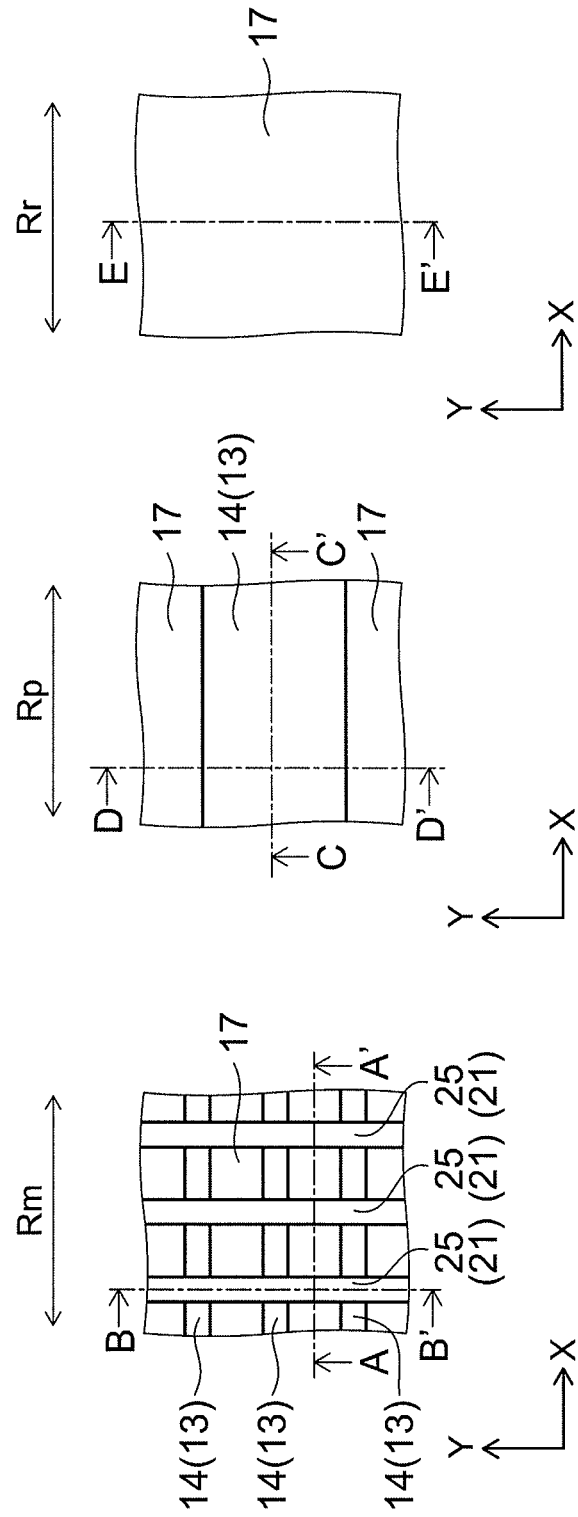

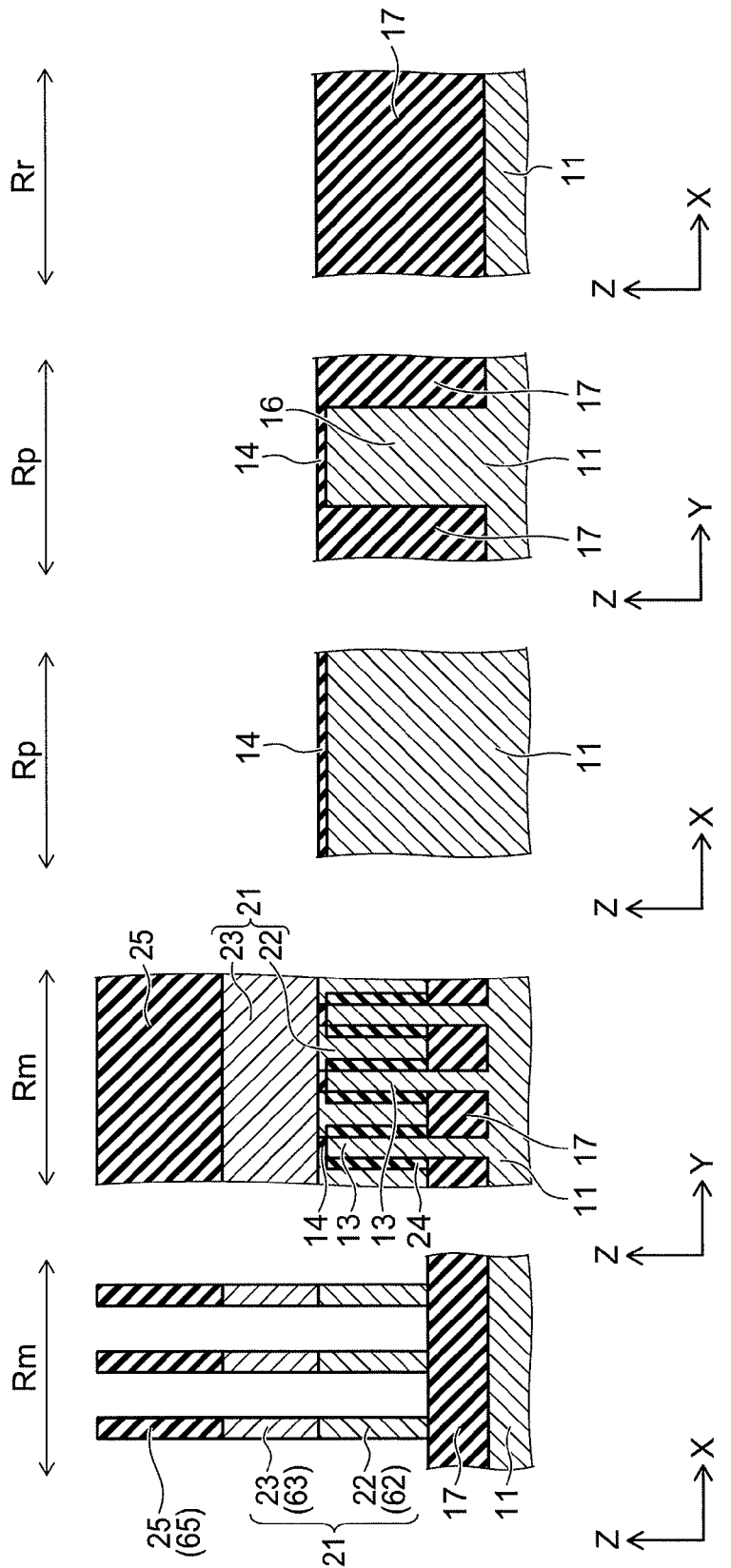

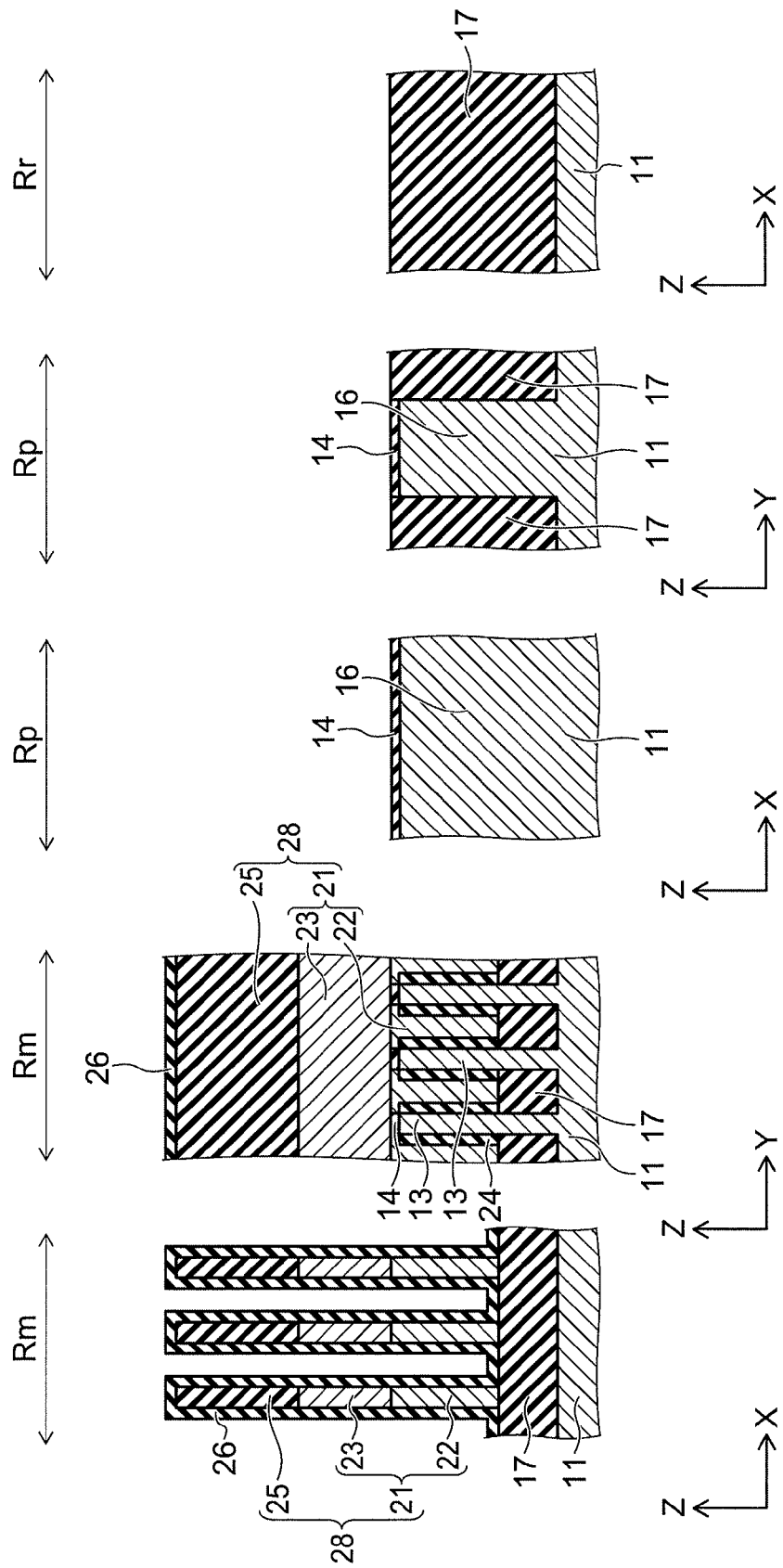

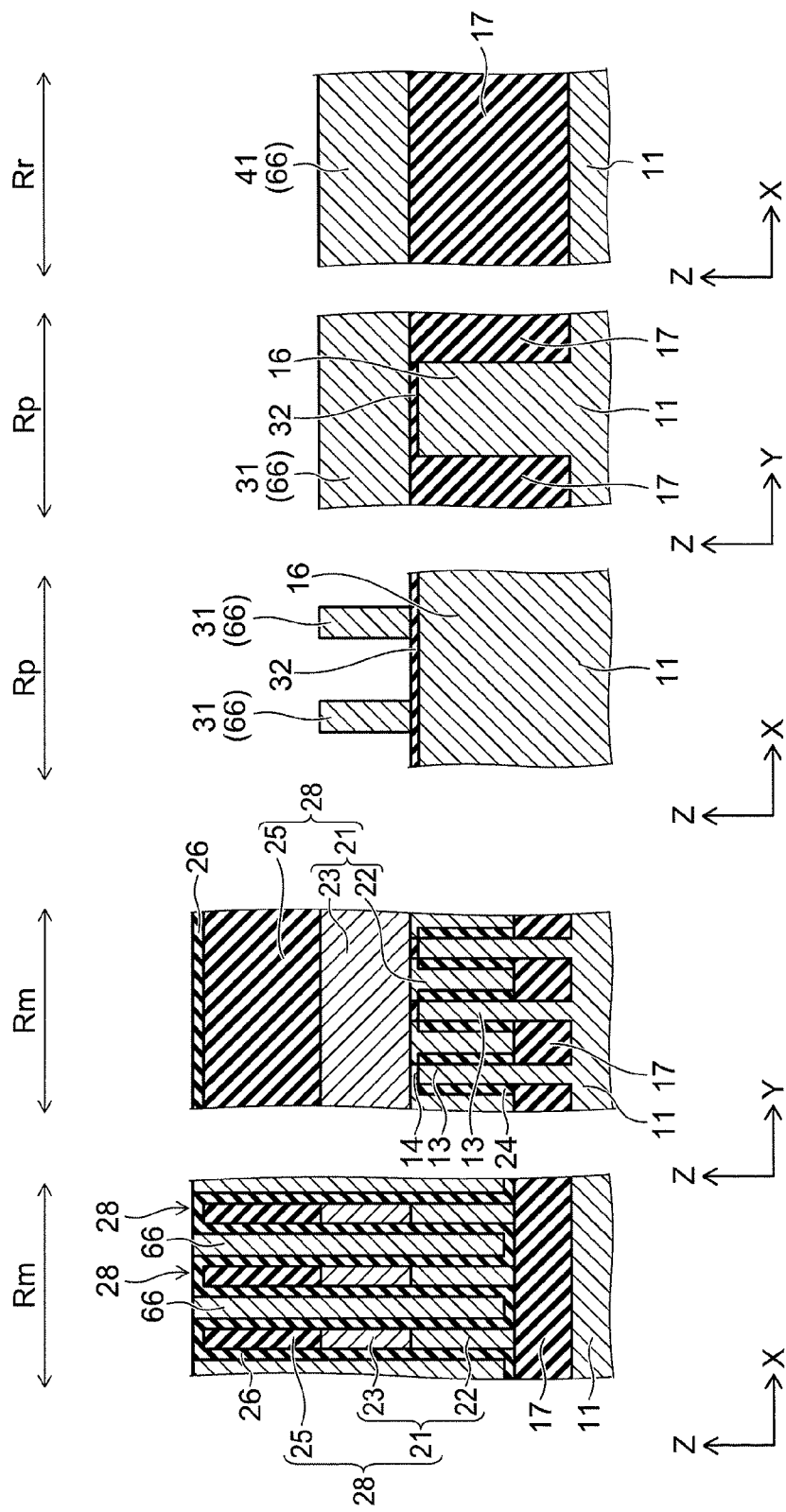

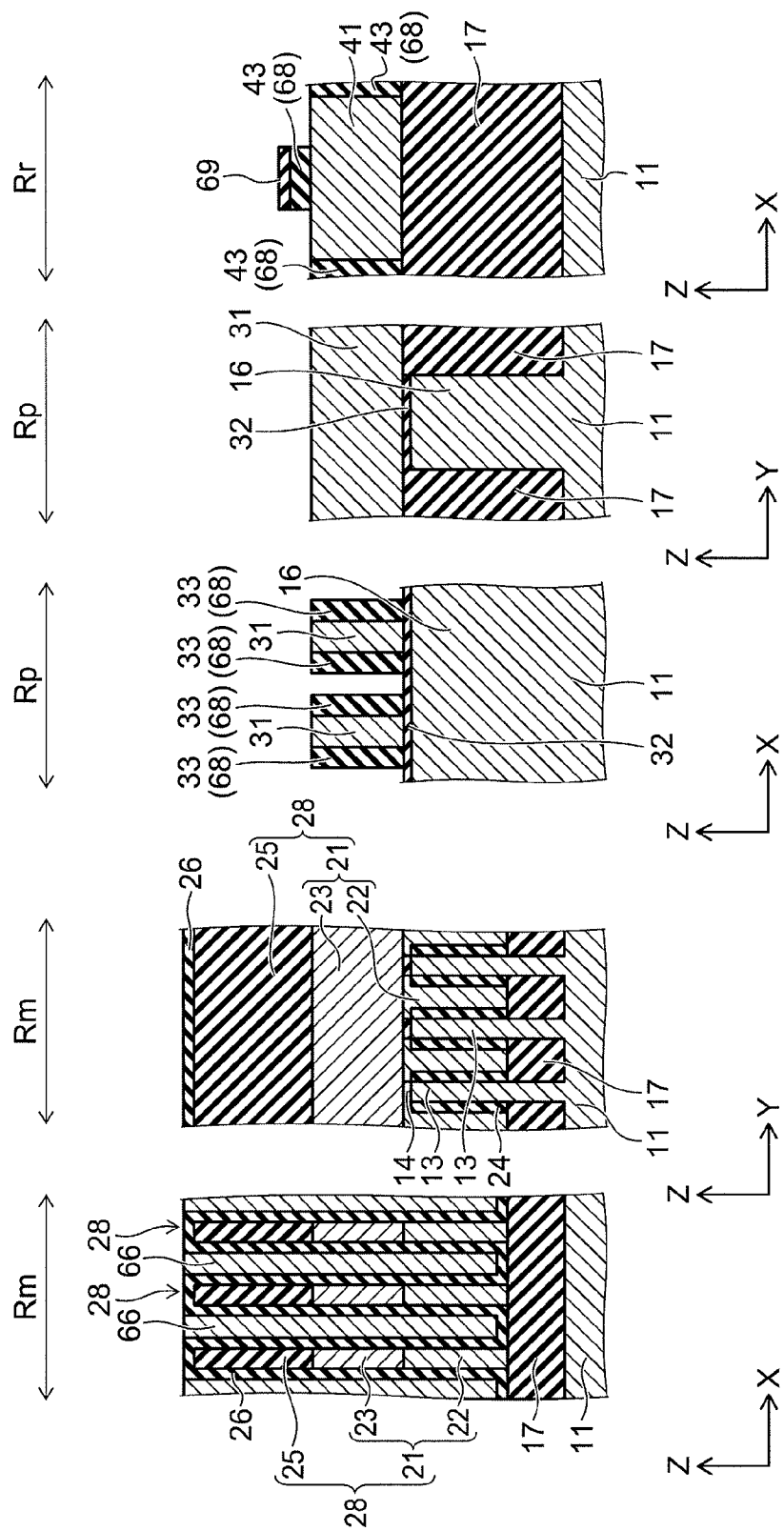

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2011-194161, filed on Sep. 6, 2011; the entire contents of which are incorporated herein by reference.

FIELD

Embodiments described herein relate generally to a semiconductor device and method for manufacturing same.

BACKGROUND

In recent years, MRAM (Magnetoresistive Random Access Memory) has been proposed as a new memory device in which data is stored by utilizing the spin of electrons. In MRAM, multiple memory cells are arranged in an array configuration; and a magnetoresistive memory element and a transistor are provided in each of the memory cells. To increase the integration of the memory cells in MRAM, it is necessary to downscale the transistors while ensuring the prescribed on-state current.

On the other hand, Fin-type MOSFETs (hereinbelow called FinFETs) have been proposed to realize both higher integration and a larger on-state current for MOSFETs (Metal-Oxide-Semiconductor Field-Effect Transistors). In FinFETs, a fin having a protruding configuration extending in one direction is formed in the upper surface of a semiconductor substrate; and a gate electrode extending in another direction is provided to straddle the fin. Thereby, the outer circumference of the portion of the fin surrounded by the gate electrode is used as the channel region; and the channel width can be enlarged without increasing the element surface area.

Therefore, it is conceivable to use FinFETs as the transistors of MRAM to increase the integration of the memory cells of the MRAM. However, in such a case, it is unfortunately difficult to adjust the thresholds to the respective optimal values for the multiple types of transistors included in the MRAM.

BRIEF DESCRIPTION OF THE DRAWINGS

FIGS. 2A to 2E are cross-sectional views illustrating the semiconductor device according to the embodiment;

FIG. 4A to 4E are cross-sectional views of processes, illustrating the method for manufacturing the semiconductor device according to the embodiment;

FIG. 5A to 5E are cross-sectional views of processes, illustrating the method for manufacturing the semiconductor device according to the embodiment;

FIG. 6A to 6E are cross-sectional views of processes, illustrating the method for manufacturing the semiconductor device according to the embodiment;

FIG. 7A to 7E are cross-sectional views of processes, illustrating the method for manufacturing the semiconductor device according to the embodiment;

FIG. 8A to 8E are cross-sectional views of processes, illustrating the method for manufacturing the semiconductor device according to the embodiment;

FIG. 9A to 9C are cross-sectional views of processes, illustrating the method for manufacturing the semiconductor device according to the embodiment;

FIG. 10A to 10E are cross-sectional views of processes, illustrating the method for manufacturing the semiconductor device according to the embodiment;

FIG. 11A to 11E are cross-sectional views of processes, illustrating the method for manufacturing the semiconductor device according to the embodiment;

FIG. 13A to 13E are cross-sectional views of processes, illustrating the method for manufacturing the semiconductor device according to the embodiment;

FIG. 15A to 15E are cross-sectional views of processes, illustrating the method for manufacturing the semiconductor device according to the embodiment;

DETAILED DESCRIPTION

Figure 1C:
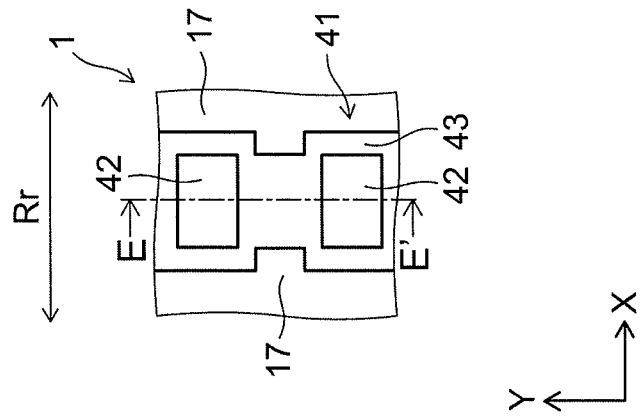
FIGS. 1A to 1C are plan views illustrating the semiconductor device according to the embodiment.

In general, according to one embodiment, a semiconductor device includes, a semiconductor substrate including a plurality of fins formed in an upper surface of the semiconductor substrate in a first region to extend in a first direction, a first gate electrode extending in a second direction intersecting the first direction to straddle the fins, a first gate insulating film provided between the first gate electrode and the fins, a second gate electrode provided on the semiconductor substrate in the second region; and a second gate insulating film provided between the semiconductor substrate and the second gate electrode. A layer structure of the first gate electrode is different from a layer structure of the second gate electrode.

In general, according to another embodiment, a semiconductor device including a memory array region, a peripheral circuit region, and a resistance element region set in the device is provided The device includes: a semiconductor substrate including a plurality of fins formed in an upper surface of the semiconductor substrate in the memory array region to extend in a first direction, the upper surface of the semiconductor substrate of the resistance element region being positioned lower than the upper surface of the semiconductor substrate of the peripheral circuit region; a first gate electrode extending in a second direction intersecting the first direction to straddle the fins; a first gate insulating film provided between the first gate electrode and the fins; a second gate electrode provided on the semiconductor substrate in the peripheral circuit region; a second gate insulating film provided between the semiconductor substrate and the second gate electrode; an element-separating insulating film provided on the semiconductor substrate, an upper surface of the element-separating insulating film of the memory array region being positioned lower than the upper surface of the element-separating insulating film of the resistance element region; a resistance member provided on the element-separating insulating film in the resistance element region, a composition and a thickness of the resistance member being the same as a composition and a thickness of the second gate electrode; and a magnetoresistive memory element provided in the memory array region. The first gate electrode includes: a lower portion including silicon; and an upper portion including a metal. The second gate electrode is formed of a material including silicon. A lower end of the first gate electrode is positioned lower than upper ends of the fins. A lower surface of the second gate electrode is positioned higher than the upper surface of the semiconductor substrate. The upper ends of the fins, the upper surface of the semiconductor substrate of the second region, and the upper surface of the element-separating insulating film of the third region are positioned at the same height. First source/drain regions are formed in regions of the fins. A region of the fins directly under the first gate electrode is interposed between the first source/drain regions. Second source/drain regions are formed in regions of an upper layer portion of the semiconductor substrate. A region of the upper layer portion of the semiconductor substrate directly under the second gate electrode is interposed between the second source/drain regions.

In general, according to another embodiment, a method for manufacturing a semiconductor device includes: selectively removing a semiconductor substrate to form a plurality of fins extending in a first direction in a first region; filling an element-separating insulating film into a lower portion of a portion between the fins; forming a first gate insulating film on a surface of a portion of the fins protruding from the element-separating insulating film; forming a first conductive film on the fins and the element-separating insulating film; selectively removing the first conductive film to remove the first conductive film in a second region and form a first gate electrode extending in a second direction intersecting the first direction to straddle the fins in the first region; forming a second gate insulating film on the second region of an upper surface of the semiconductor substrate; forming a second conductive film; and selectively removing the second conductive film to form a second gate electrode on the second gate insulating film.

Embodiments of the invention will now be described with reference to the drawings.

Figure 1B:
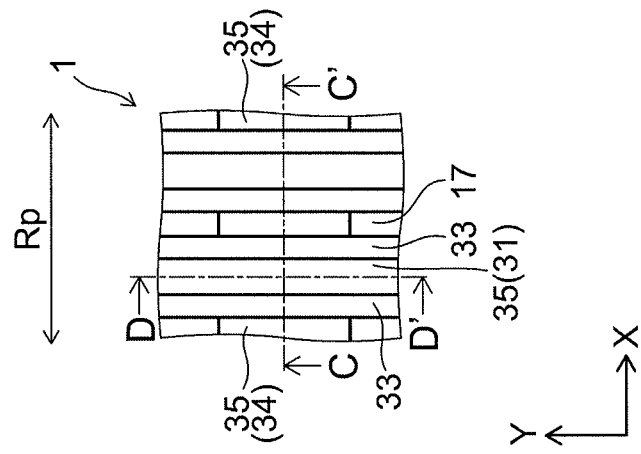
Figure 1A:
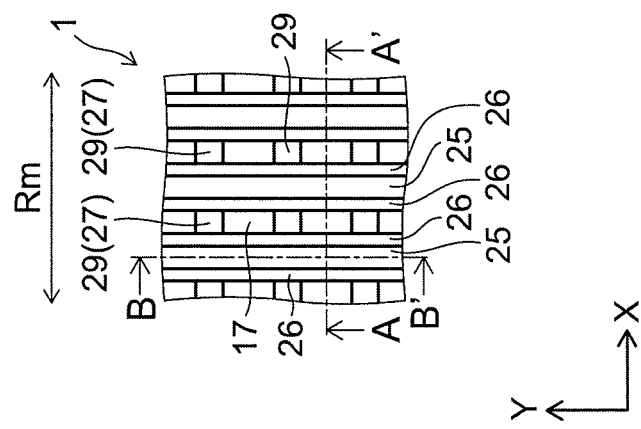

FIGS. 1A to 1C are plan views illustrating the semiconductor device according to the embodiment. FIG. 1A illustrates a memory array region; FIG. 1B illustrates a peripheral circuit region; and FIG. 1C illustrates a resistance element region.

FIGS. 2A to 2E are cross-sectional views illustrating the semiconductor device according to the embodiment. FIG. 2A is a cross-sectional view along line A-A' of FIG. 1A; FIG. 2B is a cross-sectional view along line B-B' of FIG. 1A; FIG. 2C is a cross-sectional view along line C-C' of FIG. 1B; FIG. 2D is a cross-sectional view along line D-D' of FIG. 1B; and FIG. 2E is a cross-sectional view along line E-E' of FIG. 1C.

Figures 3A, 3B:
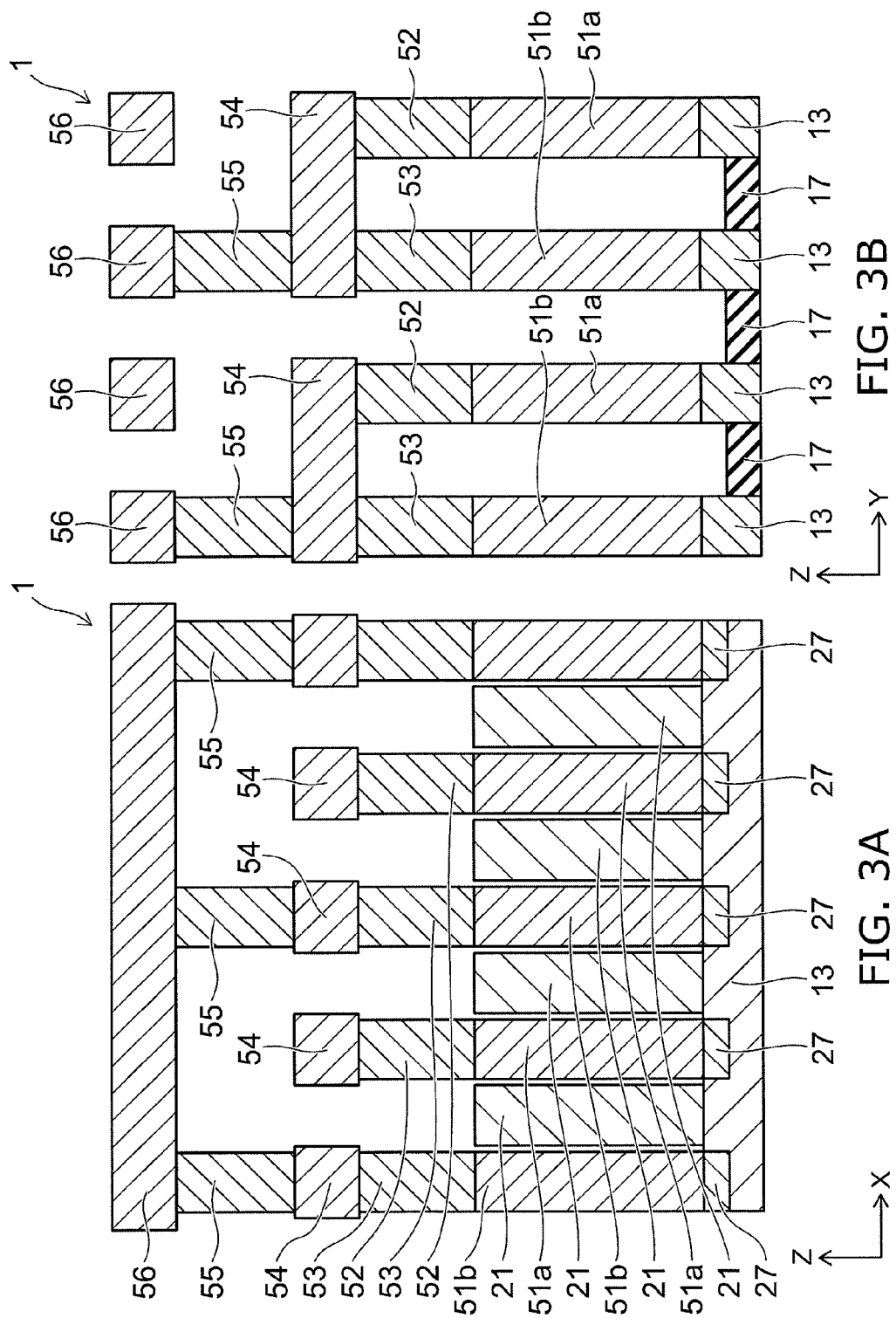
FIGS. 3A and 3B are schematic cross-sectional views illustrating the memory array region of the semiconductor device according to the embodiment.
Figures 12A, 12B, 12C, 12D, 12E:
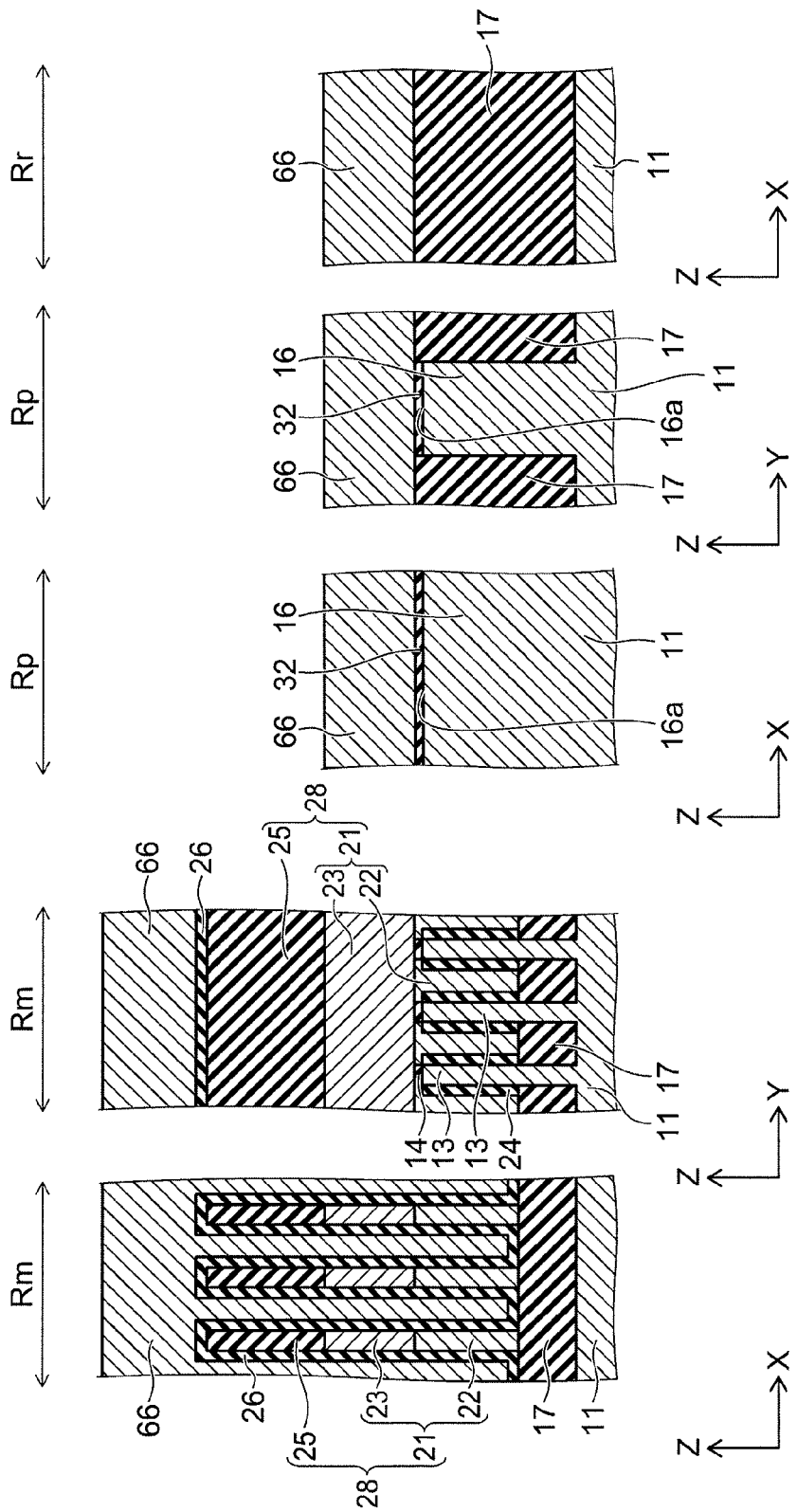
FIG. 12A to 12E are cross-sectional views of processes, illustrating the method for manufacturing the semiconductor device according to the embodiment.
Figures 14A, 14B, 14C, 14D, 14E:
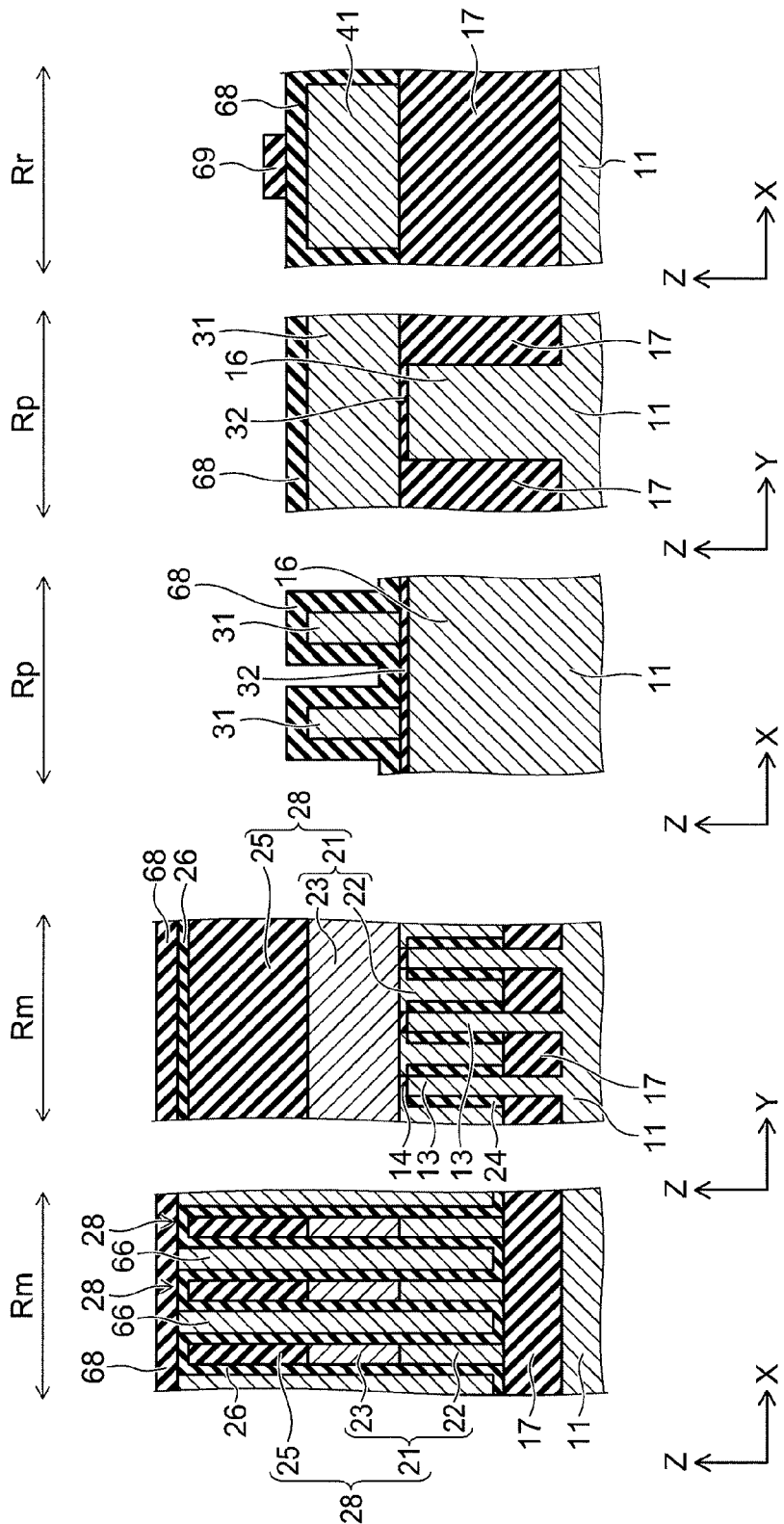
FIG. 14A to 14E are cross-sectional views of processes, illustrating the method for manufacturing the semiconductor device according to the embodiment.
Figures 16A, 16B, 16C, 16D, 16E:
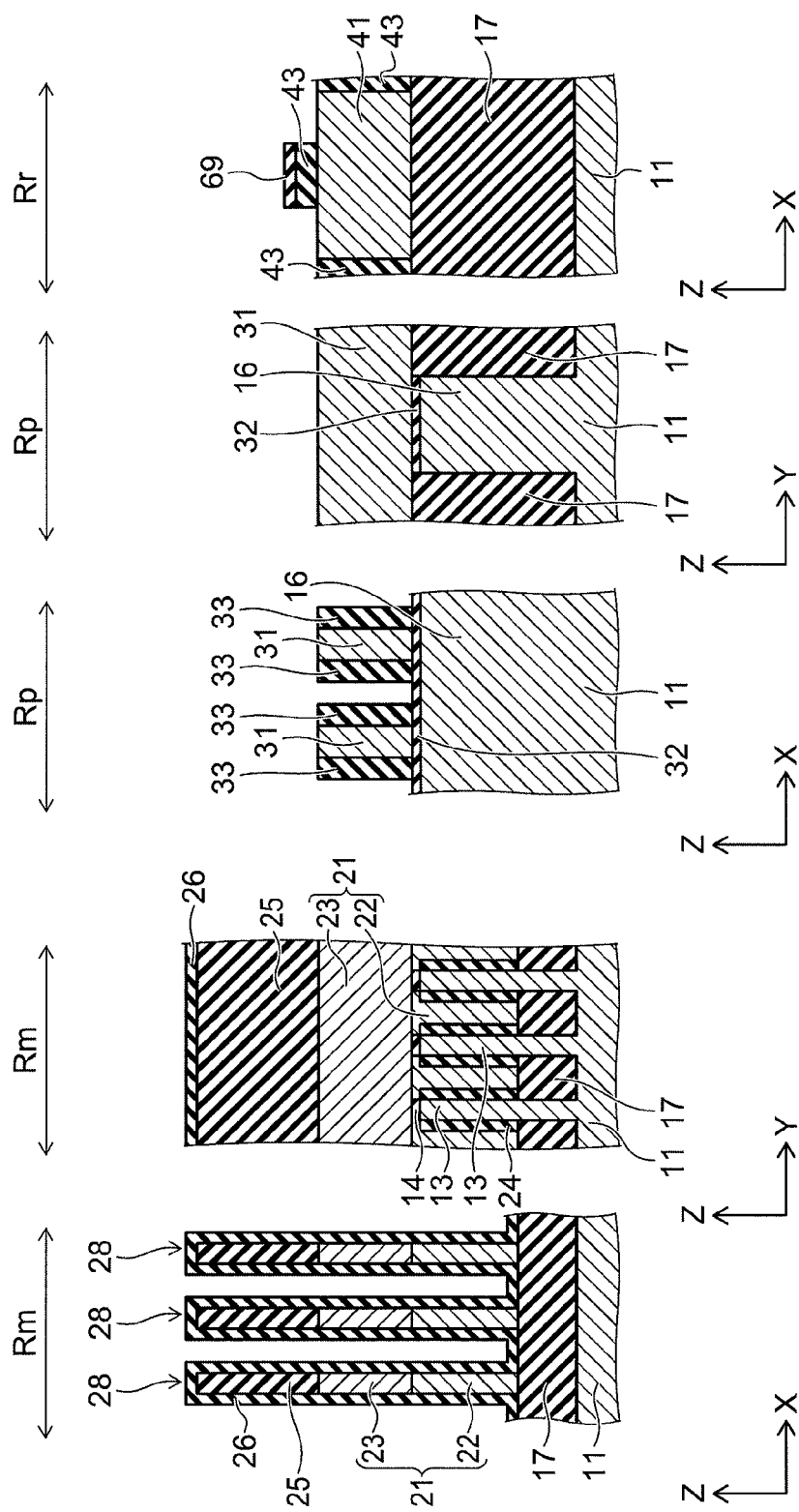
FIG. 16A to 16E are cross-sectional views of processes, illustrating the method for manufacturing the semiconductor device according to the embodiment.
Figures 17A, 17B, 17C, 17D, 17E:
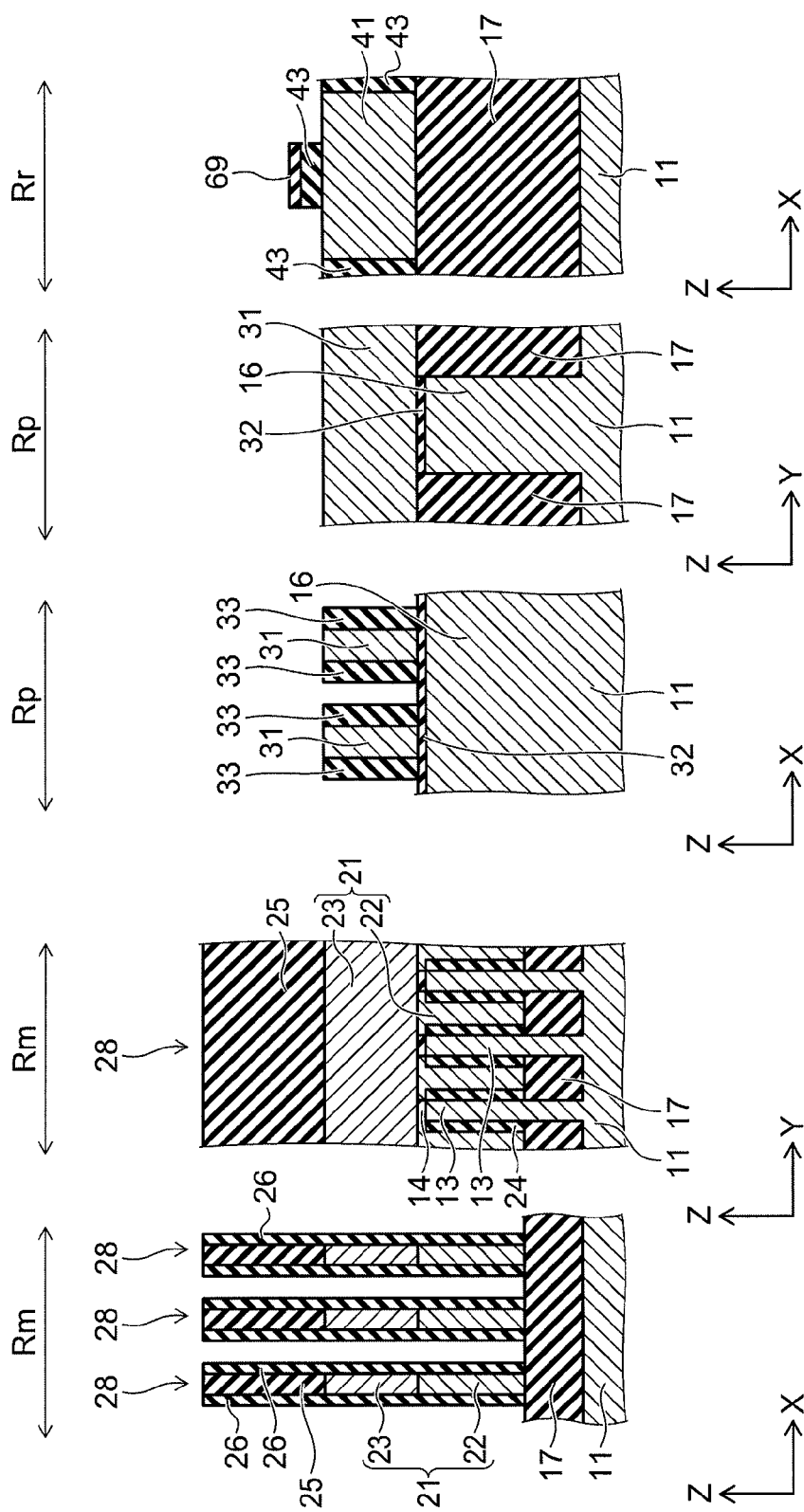
FIG. 17A to 17E are cross-sectional views of processes, illustrating the method for manufacturing the semiconductor device according to the embodiment.

FIGS. 3A and 3B are schematic cross-sectional views illustrating the memory array region of the semiconductor device according to the embodiment.

For convenience of illustration, the inter-layer insulating film and the upper structure above the inter-layer insulating film are not illustrated in FIGS. 1A to 1C and FIGS. 2A to 2E. As a general rule, only the conductive portions are illustrated in FIGS. 3A and 3B, and the insulating portions are not illustrated.

As illustrated in FIGS. 1A to 1C and FIGS. 2A to 2E, the semiconductor device 1 according to the embodiment is a semiconductor memory device, and more specifically, an MRAM in which a memory array region Rm, a peripheral circuit region Rp, and a resistance element region Rr are set. Multiple memory cells are provided in the memory array region Rm; and data is stored in the memory cells. A peripheral circuit configured to drive the memory cells is provided in the peripheral circuit region Rp. A resistance element is provided in the resistance element region Rr. This resistance element is connected to, for example, the peripheral circuit.

A silicon substrate 11 is provided in the semiconductor device 1. However, different patterning is performed on an upper surface 11a of the silicon substrate 11 for each of the regions described above.

In the memory array region Rm, multiple trenches 12 extending in one direction (hereinbelow called the X direction) are made in the upper surface 11a of the silicon substrate 11. Thereby, the portions of the upper layer portion of the silicon substrate 11 between the trenches 12 are fins 13. The fins 13 are multiply formed and are arranged periodically; and each of the fins 13 extends in the X direction. A silicon nitride film 14 is provided on the upper surfaces of the fins 13.

In the peripheral circuit region Rp, a trench 15 is made in a frame-like configuration in the upper surface 11a of the silicon substrate 11. The portion of the upper layer portion of the silicon substrate 11 surrounded by the trench 15 is an active portion 16. The active portion 16 is, for example, multiply formed and is partitioned by the trench 15.

The upper layer portion of the silicon substrate 11 is removed in the resistance element region Rr. Thereby, the upper surface 11a of the silicon substrate 11 of the resistance element region Rr is positioned lower than the upper ends of the fins 13 of the memory array region Rm and the upper surface 11a of the silicon substrate 11 of the peripheral circuit region Rp and is positioned at the same height as the bottom surfaces of the trenches 12 of the memory array region Rm and the bottom surface of the trench 15 of the peripheral circuit region Rp.

An element-separating insulating film 17 made of an insulating material such as, for example, silicon oxide, etc., is provided on the silicon substrate 11. In the memory array region Rm, the element-separating insulating film 17 is disposed in the lower portions of the trenches 12. In the peripheral circuit region Rp, the element-separating insulating film 17 is disposed inside the trench 15. In the resistance element region Rr, the element-separating insulating film 17 is disposed on the silicon substrate 11. The height of an upper surface 17a of the element-separating insulating film 17 is the same in the peripheral circuit region Rp and the resistance element region Rr and matches the heights of the upper ends of the fins 13 and upper surfaces 16a of the active portions 16. The upper surface 17a of the element-separating insulating film 17 of the memory array region Rm is positioned lower than the upper surface 17a of the element-separating insulating film 17 of the peripheral circuit region Rp and the resistance element region Rr.

In the memory array region Rm, multiple gate electrodes 21 are provided periodically on the silicon substrate 11 and the element-separating insulating film 17. Each of the gate electrodes 21 extends in a direction (hereinbelow called the Y direction) orthogonal to the X direction to straddle the fins 13. In other words, the lower ends of the gate electrodes 21 are positioned lower than the upper ends of the fins 13. Lower portions 22 of the gate electrodes 21 are formed of polysilicon containing an impurity. Upper portions 23 of the gate electrodes 21 are formed of a metal such as, for example, tungsten, etc. The interface between the lower portion 22 and the upper portion 23 is a plane at, for example, the same height as the upper end faces of the fins 13. A direction orthogonal to both the X direction and the Y direction, i.e., the vertical direction, is called the Z direction.

A gate insulating film 24 is provided between the gate electrodes 21 and the fins 13. The gate insulating film 24 covers the side surfaces of the portions of the fins 13 that protrude from the upper surface 17a of the element-separating insulating film 17. A hard mask 25 made of, for example, silicon nitride is provided in the region directly above each of the gate electrodes 21. A sidewall 26 made of an insulating material such as, for example, silicon nitride, etc., is provided on the side surfaces of a stacked body 28 made of the gate electrode 21 and the hard mask 25. The source/drain regions 27 in which an impurity is introduced are formed in the portions of the fins 13 between the regions directly under the gate electrodes 21 and the sidewalls 26. In other words, a region of the fin 13 directly under the gate electrode 21 is interposed between a pair of mutually-adjacent source/drain regions 27. A silicide layer 29 is formed in the upper layer portions of the source/drain regions 27. Thereby, a FinFET is formed at each of the most proximal points between the gate electrodes 21 and the fins 13. Accordingly, multiple FinFETs are arranged in a matrix configuration in the memory array region Rm. The electrical characteristics of these FinFETs are substantially uniform.

In the peripheral circuit region Rp, a gate electrode 31 extending in one direction is provided on the silicon substrate 11 and the element-separating insulating film 17 to cross a region directly above the active portion 16. For example, two gate electrodes 31 cross the region directly above one active portion 16. Although the direction in which the gate electrodes 31 extend is the Y direction in FIGS. 1A to 1C and FIGS. 2A to 2E, this is not limited thereto. The gate electrodes 31 are, for example, made of a conductive material including silicon and are formed of, for example, polysilicon containing an impurity. A gate insulating film 32 is provided between the active portions 16 and the gate electrodes 31. The upper surfaces of the active portions 16 and the lower surfaces of the gate electrodes 31 are flat. In other words, the lower surfaces of the gate electrodes 31 are positioned higher than the upper surfaces of the active portions 16. Accordingly, the gate insulating film 32 also has a planar configuration.

A sidewall 33 made of, for example, silicon nitride is provided on both side surfaces of each of the gate electrodes 31. The source/drain regions 34 in which an impurity is introduced are formed in portions of the upper layer portion of the active portion 16 such that a region directly under the gate electrode 31 and the sidewalls 33 is interposed between the source/drain regions 34. A silicide layer 35 made of a silicide such as, for example, nickel silicide, etc., is formed in the upper layer portions of the gate electrodes 31 and the upper layer portions of the source/drain regions 34. The portion of the upper layer portion of the active portion 16 corresponding to the region directly under the gate electrode 31, i.e., the portion interposed between a pair of source/drain regions 34, is used as a channel region. Thus, a planar MOSFET is formed of the active portion 16, the gate insulating film 32, and the gate electrodes 31. Multiple planar MOSFETs formed in the peripheral circuit region Rp are divided into several types having different electrical characteristics. The peripheral circuit includes these planar MOSFETs.

In the resistance element region Rr, a resistance member 41 made of, for example, polysilicon containing an impurity is provided on the element-separating insulating film 17. The configuration of the resistance member 41 is a substantially rectangular parallelepiped in which, for example, the width of the longitudinal-direction central portion is narrower than the widths of the two end portions. The resistance member 41 and the gate electrode 31 are formed by patterning the same polysilicon film and accordingly have the same compositions and thicknesses. A silicide layer 42 is formed on the upper surfaces of both of the end portions of the resistance member 41. The silicide layers 42 and 35 are formed by the same processing and accordingly have the same compositions and thicknesses. An insulating film 43 is provided on the region of the upper surface of the resistance member 41 where the silicide layer 42 is not formed and on the side surface of the resistance member 41. The insulating film 43 is formed simultaneously with the sidewall 33. Accordingly, the insulating film 43 and the sidewall 33 have the same composition.

An inter-layer insulating film (not illustrated) is provided to cover the fins 13, the gate electrodes 21, the gate electrodes 31, the resistance members 41, and the like.

In the memory array region Rm as illustrated in FIGS. 3A and 3B, contacts 51a and 51b are provided on two portions of the fin 13 such that a region directly under the gate electrode 21 is interposed between the two portions, that is, on the regions directly above the portions where the source/drain regions 27 are formed. A magnetoresistive memory element 52 is provided on the contact 51a; and a via 53 is provided on the contact 51b. Thereby, one of the pair of source/drain regions 27 included in each of the FinFETs is connected to the magnetoresistive memory element 52 by the contact 51a; and the other of the source/drain regions 27 is connected to the via 53 by the contact 51b. The magnetoresistive memory element 52 is an element configured to store data by having an electrical resistance value that changes when electrons having spin of a designated direction are injected.

An intermediate interconnect 54 is provided in a rectangular configuration above the magnetoresistive memory element 52 and the via 53 with the Y direction as the longitudinal direction of the intermediate interconnect 54. The magnetoresistive memory element 52 and the via 53 connected to mutually adjacent fins 13 are connected to each other by the intermediate interconnect 54. A via 55 is provided on the intermediate interconnect 54 in the region directly above the via 53. An upper layer interconnect 56 extending in the X direction is provided on the via 55. The intermediate interconnect 54 is connected to the upper layer interconnect 56 by the via 55. Then, one memory cell is formed of one FinFET and one magnetoresistive memory element 52. In other words, the FinFET described above is a cell transistor.

A method for manufacturing the semiconductor device according to the embodiment will now be described.

FIG. 4A to FIG. 8E and FIG. 10A to FIG. 17E are cross-sectional views of processes, illustrating the method for manufacturing the semiconductor device according to the embodiment. In each of the drawings, drawing A corresponds to the cross-sectional view along line A-A' of FIG. 1A; drawing B corresponds to the cross-sectional view along line B-B' of FIG. 1A; drawing C corresponds to the cross-sectional view along line C-C' of FIG. 1B; drawing D corresponds to the cross-sectional view along line D-D' of FIG. 1B; and drawing E corresponds to the cross-sectional view along line E-E' of FIG. 1C.

FIGS. 9A to 9C are process plan views illustrating the method for manufacturing the semiconductor device according to the embodiment. FIG. 9A illustrates the memory array region; FIG. 9B illustrates the peripheral circuit region; and FIG. 9C illustrates the resistance element region.

FIG. 10A is a cross-sectional view along line A-A' of FIG. 9A; FIG. 10B is a cross-sectional view along line B-B' of FIG. 9A; FIG. 10C is a cross-sectional view along line C-C' of FIG.

9B; FIG. 10D is a cross-sectional view along line D-D' of FIG. 9B; and FIG. 10E is a cross-sectional view along line E-E' of FIG. 9C.

First, as illustrated in FIGS. 4A to 4E, the silicon substrate 11 is prepared. Then, the silicon nitride film 14 is formed on the silicon substrate 11.

Then, as illustrated in FIGS. 5A to 5E, a mask pattern (not illustrated) is formed on the silicon nitride film 14. In the memory array region Rm, the mask pattern is formed by a sidewall process. Then, the silicon nitride film 14 and the upper layer portion of the silicon substrate 11 are selectively removed by performing etching using this mask pattern as a mask. Thereby, in the memory array region Rm, the trenches 12 extending in the X direction are multiply made in the upper surface of the silicon substrate 11; and the portions of the silicon substrate 11 between the trenches 12 are used as the fins 13. In the peripheral circuit region Rp, the trench 15 is made in a frame-like configuration in the upper surface of the silicon substrate 11; and the portion of the silicon substrate 11 surrounded by the trench 15 is used as the active portion 16. In the resistance element region Rr, the upper surface 11a of the silicon substrate 11 is caused to recede to, for example, the same height as the bottom surfaces of the trenches 12. At this time, the width and the spacing is the same for all of the fins 13. On the other hand, multiple active portions 16 may have mutually different configurations.

Continuing as illustrated in FIGS. 6A to 6E, silicon oxide is deposited on the entire surface and is densified by heating. Thereby, the element-separating insulating film 17 is formed on the silicon substrate 11 and the silicon nitride film 14. Then, the upper surface 17a of the element-separating insulating film 17 is planarized to the same height as the upper surface of the silicon nitride film 14 by performing planarization such as CMP (chemical mechanical polishing), etc., using the silicon nitride film 14 as a stopper.

Then, in the memory array region Rm as illustrated in FIGS. 7A to 7E, the upper surface 17a is caused to recede by recessing the element-separating insulating film 17. As a result, the upper portions of the fins 13 protrude from the element-separating insulating film 17 and are exposed. Then, oxidation is performed. Thereby, the gate insulating film 24 made of silicon oxide is formed on the side surfaces of the upper portions of the fins 13.

Continuing as illustrated in FIGS. 8A to 8E, a polysilicon film 62 into which an impurity is added is formed on the entire surface; and CMP is performed. Thereby, the polysilicon film 62 is filled into the upper portions inside the trenches 12. At this time, the polysilicon film 62 above the silicon substrate 11 and above the element-separating insulating film 17 may be removed or may remain. FIGS. 8A to 8E illustrate the case where the polysilicon film 62 above the element-separating insulating film 17 and above the silicon substrate 11 of the fins 13 is completely removed and remains only inside the trenches 12. Then, a metal film 63 is formed on the entire surface by depositing a metal, e.g., tungsten on the entire surface. Continuing, a silicon nitride film 65 is formed on the entire surface by depositing silicon nitride on the entire surface.

Then, in the memory array region Rm as illustrated in FIGS. 9A to 9C and FIGS. 10A to 10E, a mask pattern (not illustrated) is formed on the silicon nitride film 65. A pattern having a line configuration extending in the Y direction is multiply formed in this mask pattern by a sidewall process. On the other hand, in the peripheral circuit region Rp and the resistance element region Rr, the mask pattern is not formed.

Continuing, the silicon nitride film 65, the metal film 63, and the polysilicon film 62 are etched using this mask pattern as a mask. At this time, the etching stops at the silicon nitride film 14 in the regions directly above the fins 13. Thereby, in the memory array region Rm, the silicon nitride film 65 is patterned into multiple hard masks 25 extending in the Y direction; and the metal film 63 and the polysilicon film 62 are patterned into the gate electrodes 21. As a result, the metal film 63 becomes the upper portions 23 of the gate electrodes 21; and the polysilicon film 62 becomes the lower portions 22 of the gate electrodes 21. On the other hand, in the peripheral circuit region Rp and the resistance element region Rr, the silicon nitride film 65, the metal film 63, and the polysilicon film 62 are removed.

Then, as illustrated in FIGS. 11A to 11E, an insulating film is formed by depositing an insulating material such as, for example, silicon nitride, etc., on the entire surface. Then, by patterning this insulating film, this insulating film remains in the memory array region Rm and is removed from the peripheral circuit region Rp and the resistance element region Rr. At this time, the silicon nitride film 14 also is removed from the peripheral circuit region Rp and the resistance element region Rr. As a result, in the memory array region Rm, the sidewall 26 is formed on the element-separating insulating film 17 to cover the stacked body 28 made of the gate electrode 21 and the hard mask 25.

Continuing as illustrated in FIGS. 12A to 12E, in the peripheral circuit region Rp, the gate insulating film 32 made of silicon oxide is formed on the upper surfaces 16a of the active portions 16 of the silicon substrate 11 by performing oxidation. Then, a polysilicon film 66 is formed on the entire surface by depositing polysilicon into which an impurity is added. The polysilicon film 66 is filled also between the stacked bodies 28.

Then, as illustrated in FIGS. 13A to 13E, an antireflective film (not illustrated) and a mask pattern (not illustrated) are formed on the polysilicon film 66; and etching is performed using this mask pattern as a mask. Thereby, the portion of the polysilicon film 66 disposed in the peripheral circuit region Rp is patterned into the gate electrodes 31; and the portion of the polysilicon film 66 disposed in the resistance element region Rr is patterned into the resistance member 41. The portion of the polysilicon film 66 disposed in the memory array region Rm and positioned above the stacked bodies 28 is removed; and the portion of the polysilicon film 66 disposed in the memory array region Rm and filled between the stacked bodies 28 remains.

The gate electrodes 31 are patterned into line configurations that extend in one direction to cross the region directly above the active portions 16. In such a case, the width of the gate electrode 31 may be different between the multiple gate electrodes 31 according to the electrical characteristics of the planar MOSFETs to be formed. The resistance member 41 is patterned into a substantially rectangular parallelepiped configuration extending in one direction; and the width of the longitudinal-direction central portion is narrower than the width of each of the longitudinal-direction end portions. In such a case, the configuration of the resistance member 41 is controlled according to the size of the resistance value to be realized by the resistance member 41.

Then, as illustrated in FIGS. 14A to 14E, an insulating film 68 made of an insulating material such as, for example, a silicon nitride film, etc., is formed on the entire surface. At this time, although the insulating film 68 is formed on the side surfaces of the gate electrodes 31 and on the side surfaces of the resistance member 41, the insulating film 68 is not formed on the side surfaces of the stacked bodies 28 because the polysilicon film 66 is filled between the stacked bodies 28. Then, a hard mask 69 is formed on the insulating film 68 and patterned such that the mask material 69 remains on the upper surface of the resistance member 41 in a region of each of the longitudinal-direction end portions excluding the central portion.

Continuing as illustrated in FIGS. 15A to 15E, etch-back of the insulating film 68 is performed. Thereby, the insulating film 68 of the entire memory array region Rm is removed; the insulating film 68 on the upper surfaces of the gate electrodes 31, the active portions 16, and the element-separating insulating film 17 of the peripheral circuit region Rp is removed; the insulating film 68 of the regions on the upper surface of the element-separating insulating film 17 and on the upper surface of the resistance member 41 not covered with the hard mask 69 in the resistance element region Rr is removed; and the insulating film 68 remains on the side surfaces of the gate electrodes 31, on the side surfaces of the resistance member 41, and in the region of the upper surface of the resistance member 41 directly under the hard mask 69. As a result, the insulating film 68 is selectively removed to form the sidewall 33 on the side surfaces of the gate electrodes 31 and form the insulating film 43 on the region of the upper surface of the resistance member 41 covered with the hard mask 69 and on the side surfaces of the resistance member 41.

Then, as illustrated in FIGS. 16A to 16E, the polysilicon film 66 between the stacked bodies 28 is removed by forming a mask (not illustrated) that covers the peripheral circuit region Rp and the resistance element region Rr and leaves the memory array region Rm exposed and by performing wet etching using this mask.

Continuing as illustrated in FIGS. 17A to 17E, the portions of the sidewalls 26 formed on the upper surfaces of the stacked bodies 28 are removed.

Then, as illustrated in FIGS. 1A to 1C, FIGS. 2A to 2E, and FIGS. 3A and 3B, a resist mask (not illustrated) that does not cover the memory array region Rm is formed; and an impurity is implanted using this resist mask, the stacked bodies 28, and the sidewalls 26 as a mask. Thereby, the source/drain regions 27 are formed in the portions of the fins 13 not covered with the stacked bodies 28 and the sidewalls 26. As a result, a FinFET is formed at each of the most proximal points between the gate electrodes 21 and the fins 13.

Continuing, a resist mask (not illustrated) that does not cover the peripheral circuit region Rp is formed; and an impurity is implanted using this resist mask, the gate electrodes 31, and the sidewalls 33 as a mask. Thereby, the source/drain regions 34 are formed in the portions of the active portions 16 not covered with the gate electrodes 31 and the sidewalls 33. As a result, a planar MOSFET is formed at each of the most proximal points between the active portions 16 and the gate electrodes 31. In such a case, the implantation amount and the implantation depth of the impurity may be different according to the electrical characteristics necessary for each of the MOSFETs.

Then, the exposed surface of the silicon is silicided by depositing, for example, nickel and by heating. Thereby, the silicide layer 29 is formed in the upper layer portions of the source/drain regions 27; the silicide layer 35 is formed in the upper layer portions of the gate electrodes 31 and the upper layer portions of the source/drain regions 34; and the silicide layer 42 is formed in the upper surface of the central portion of both of the longitudinal-direction end portions of the resistance member 41.

Continuing, the fins 13, the gate electrodes 21, the gate electrodes 31, the resistance members 41, and the like are covered by forming an inter-layer insulating film (not illustrated) on the entirety. Then, the contacts 51a and 51b are formed by making contact holes in the inter-layer insulating film and the silicon nitride film 14 and filling a conductive material into the interiors of the contact holes. Continuing, the magnetoresistive memory element 52 is formed on the contact 51a; and the via 53 is formed on the contact 51b. Then, the intermediate interconnect 54 is formed above the magnetoresistive memory element 52 and the via 53. The magnetoresistive memory element 52 and the via 53 that are connected to mutually adjacent fins 13 are connected to the same intermediate interconnect 54. Continuing, the via 55 is formed on the intermediate interconnect 54 in the region directly above the via 53; and the upper layer interconnect 56 extending in the X direction is formed on the via 55. Thus, the semiconductor device 1 according to the embodiment is manufactured.

Effects of the embodiment will now be described.

In the process illustrated in FIGS. 5A to 5E in the embodiment, the silicon substrate 11 is selectively removed to form the fins 13 in the memory array region Rm and the active portions 16 in the peripheral circuit region Rp.

Then, in the process illustrated in FIGS. 8A to 8E, the polysilicon film 62 and the metal film 63 are formed; and in the processes illustrated in FIGS. 9A to 9C and FIGS. 10A to 10E, the gate electrodes 21 are formed by patterning the polysilicon film 62 and the metal film 63. Subsequently, in the process illustrated in FIGS. 11A to 11E, the FinFETs are formed in the memory array region Rm by forming the sidewalls 26.

On the other hand, the gate electrodes 31 are formed in the peripheral circuit region Rp by forming the polysilicon film 66 in the process illustrated in FIGS. 12A to 12E and by patterning the polysilicon film 66 in the process illustrated in FIGS. 13A to 13E. The insulating film 68 is formed in the process illustrated in FIGS. 14A to 14E; and the sidewalls 33 are formed on the side surfaces of the gate electrodes 31 by performing etch-back of the insulating film 68 in the process illustrated in FIGS. 15A to 15E. Thus, the planar MOSFETs are formed in the peripheral circuit region Rp. When forming the insulating film 68, the sidewalls 33 are not formed on the side surfaces of the gate electrodes 21 because the polysilicon film 66 is filled between the stacked bodies 28. Thus, according to the embodiment, the planar MOSFETs can be formed in the peripheral circuit region Rp while forming the FinFETs in the memory array region Rm.

It is favorable for the transistors formed in the memory array region Rm to be highly integrated with uniform characteristics because these transistors are included in the memory cells. Therefore, the integration can be increased while ensuring the on-state current by using FinFETs as the transistors formed in the memory array region Rm. The threshold of a FinFET has one level because the FinFET is a fully-depleted transistor. Therefore, the characteristics of the FinFETs can be matched and the characteristics of the memory cells can be uniform.

On the other hand, various characteristics are necessary for the transistors formed in the peripheral circuit region Rp because these transistors are included in the peripheral circuit which includes core units, sense amplifier units, and the like. Therefore, the transistors formed in the peripheral circuit region Rp can have various sizes according to the necessary characteristics, e.g., the on-state current, by these transistors being planar MOSFETs. Because a planar MOSFET is a partially-depleted transistor, the threshold can be individually controlled by adjusting the sizes and the configurations of the active portions 16 and the gate electrodes 31, the impurity concentrations of the source/drain regions 34, and the like. Thus, the transistors having the various necessary characteristics of the peripheral circuit can be made by using planar MOSFETs as the transistors formed in the peripheral circuit region Rp. Because planar MOSFETs can be designed by utilizing existing design assets, inexpensive transistors with high reliability can be formed. Conversely, an enormous amount of experimentation and time would be necessary to collect the information necessary for the design if the existing design assets could not be utilized.

In the embodiment, it is unnecessary for the height of the gate electrodes 21 to be higher than the height necessary for the FinFETs because the FinFETs and the planar MOSFETs can be formed separately. By forming the gate electrodes 21 to be low, the subsequent processes are easier. For example, collapse of the gate electrodes 21 in the manufacturing processes can be prevented. Also, the implantation of the impurity into the source/drain regions 27 is easier. Conversely, the position of the upper surfaces of the gate electrodes 21 in the vertical direction (the Z direction) is the same as that of the upper surfaces of the gate electrodes 31 in the case where the gate electrodes 21 of the FinFETs and the gate electrodes 31 of the planar MOSFETs are formed by patterning the same conductive film. Therefore, the height of the gate electrode 21, i.e., the distance from the bottom surface of the trench 12 to the upper surface of the gate electrode 21, undesirably increases; and the subsequent processes are difficult.

When selectively removing the silicon substrate 11 in the process illustrated in FIGS. 5A to 5E in the embodiment, the upper surface 11a of the silicon substrate 11 of the resistance element region Rr is caused to recede while forming the fins 13 and the active portions 16. Then, the element-separating insulating film 17 is formed on the silicon substrate 11 in the process illustrated in FIGS. 6A to 6E; the polysilicon film 66 is formed in the process illustrated in FIGS. 12A to 12E; and the resistance members 41 are formed while forming the gate electrodes 31 by patterning the polysilicon film 66 in the process illustrated in FIGS. 13A to 13E. Thus, according to the embodiment, the resistance members 41 can be formed by the same process as that of the gate electrodes 31. As a result, the increase of the number of processes for the formation of the resistance members 41 can be suppressed; and the manufacturing cost of the semiconductor device 1 can be reduced.

According to the embodiment described above, a semiconductor device and a method for manufacturing the semiconductor device that include highly-integrated transistors can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a semiconductor substrate including a plurality of fins formed in an upper surface of the semiconductor substrate in a first region to extend in a first direction;
    a first gate electrode extending in a second direction intersecting the first direction to straddle the fins;
    a first gate insulating film provided between the first gate electrode and the fins;
    a second gate electrode provided on the semiconductor substrate in a second region:
    a second gate insulating film provided between the semiconductor substrate and the second gate electrode;
    an element-separating insulating film provided on the semiconductor substrate and disposed in a third region and in a lower portion of a portion between the fins; and
    a resistance member provided on the element-separating insulating film in the third region, a composition and a thickness of the resistance member being the same as a composition and a thickness of the second gate electrode,
    a layer structure of the first gate electrode being different from a layer structure of the second gate electrode, and
    the upper surface of the semiconductor substrate of the third region being positioned lower than the upper surface of the semiconductor substrate of the second region.

2. The device according to claim 1, wherein an upper surface of the element-separating insulating film of the first region is positioned lower than the upper surface of the element-separating insulating film of the third region.

3. The device according to claim 2, wherein upper ends of the fins, the upper surface of the semiconductor substrate of the second region, and the upper surface of the element-separating insulating film of the third region are positioned at the same height.

4. A semiconductor device including a memory array region, a peripheral circuit region, and a resistance element region set in the device, the device comprising:
    a semiconductor substrate including a plurality of fins formed in an upper surface of the semiconductor substrate in the memory array region to extend in a first direction, the upper surface of the semiconductor substrate of the resistance element region being positioned lower than the upper surface of the semiconductor substrate of the peripheral circuit region;
    a first gate electrode extending in a second direction intersecting the first direction to straddle the fins; a first gate insulating film provided between the first gate electrode and the fins;
    a second gate electrode provided on the semiconductor substrate in the peripheral circuit region;
    a second gate insulating film provided between the semiconductor substrate and the second gate electrode;
    an element-separating insulating film provided on the semiconductor substrate, an upper surface of the element-separating insulating film of the memory array region being positioned lower than the upper surface of the element-separating insulating film of the resistance element region;
    a resistance member provided on the element-separating insulating film in the resistance element region, a composition and a thickness of the resistance member being the same as a composition and a thickness of the second gate electrode; and
    a magnetoresistive memory element provided in the memory array region,
    the first gate electrode including:
        a lower portion including silicon; and
        an upper portion including a metal,
    the second gate electrode being formed of a material including silicon,
    a lower end of the first gate electrode being positioned lower than upper ends of the fins,
    a lower surface of the second gate electrode being positioned higher than the upper surface of the semiconductor substrate, the upper ends of the fins, the upper surface of the semiconductor substrate of the second region, and the upper surface of the element-separating insulating film of the third region being positioned at the same height, first source/drain regions being formed in regions of the fins, a region of the fins directly under the first gate electrode being interposed between the first source/drain regions, second source/drain regions being formed in regions of an upper layer portion of the semiconductor substrate, a region of the upper layer portion of the semiconductor substrate directly under the second gate electrode being interposed between the second source/drain regions.

* * * * *